(12) United States Patent
Kim et al.

(10) Patent No.: US 10,560,988 B2
(45) Date of Patent: Feb. 11, 2020

(54) DISPLAY MODULE AND METHOD FOR COATING THE SAME

(71) Applicant: SAMSUNG ELECTRONICS CO., LTD., Suwon-si, Gyeonggi-do (KR)

(72) Inventors: Jung-min Kim, Seoul (KR); Ho-seong Shin, Suwon-si (KR); Kyoung-hwan Jang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/286,666

(22) Filed: Feb. 27, 2019

(65) Prior Publication Data

US 2019/0200422 A1 Jun. 27, 2019

Related U.S. Application Data

(62) Division of application No. 15/477,389, filed on Apr. 3, 2017, now Pat. No. 10,251,224.

(30) Foreign Application Priority Data

Jun. 10, 2016 (KR) .................. 10-2016-0072740

(51) Int. Cl.
*H05K 3/00* (2006.01)
*H05K 3/28* (2006.01)
(Continued)

(52) U.S. Cl.
CPC ............ *H05B 33/04* (2013.01); *H05B 33/10* (2013.01); *H05B 33/12* (2013.01); *H05K 3/007* (2013.01);
(Continued)

(58) Field of Classification Search
None
See application file for complete search history.

(56) References Cited

U.S. PATENT DOCUMENTS 5,677,717 A 10/1997 Ohashi
9,293,671 B2 3/2016 Brunner et al.
(Continued)

FOREIGN PATENT DOCUMENTS

CN 102187146 A 9/2011
CN 102859729 A 1/2013
(Continued)

OTHER PUBLICATIONS

U.S. Appl. No. 15/477,389, filed Apr. 3, 2017; Kim et al.
(Continued)

*Primary Examiner* — Ashok Patel
(74) *Attorney, Agent, or Firm* — Nixon & Vanderhye P.C.

(57) ABSTRACT

The present disclosure provides a display module and a method for coating the same, which can prevent and/or reduce the occurrence of black seam between display modules that are arranged adjacent to each other. According to an example aspect of the present disclosure, a display module includes a printed circuit board; a plurality of luminous elements arranged at predetermined intervals on the printed circuit board; and a coating layer comprising a coating disposed between the respective luminous elements, disposed around side surfaces of the respective luminous elements positioned at an outermost, and formed to have a height that is substantially equal to a height of the side surfaces of the luminous elements, the coating being configured to block side light of the respective luminous elements.

6 Claims, 17 Drawing Sheets

(51) Int. Cl.
*H05B 33/04* (2006.01)
*H05B 33/10* (2006.01)
*H05B 33/12* (2006.01)
*H05K 1/02* (2006.01)
*H05K 1/18* (2006.01)

(52) U.S. Cl.
CPC ............ *H05K 3/284* (2013.01); *H05K 3/288* (2013.01); *H05K 1/0274* (2013.01); *H05K 1/181* (2013.01); *H05K 2201/09018* (2013.01); *H05K 2201/09145* (2013.01); *H05K 2201/10106* (2013.01); *H05K 2201/10522* (2013.01); *H05K 2203/1316* (2013.01); *H05K 2203/1327* (2013.01)

(56) References Cited

U.S. PATENT DOCUMENTS

| | | |
|---|---|---|
| 2002/0118321 A1 | 8/2002 | Ge |
| 2002/0163301 A1 | 11/2002 | Morley et al. |
| 2004/0156478 A1* | 8/2004 | Appleby ............... B23P 15/246 378/147 |
| 2008/0276508 A1 | 11/2008 | Lee |
| 2009/0315440 A1 | 12/2009 | Makino et al. |
| 2010/0140648 A1 | 6/2010 | Harada et al. |
| 2010/0302110 A1 | 12/2010 | Leem |
| 2011/0176064 A1 | 7/2011 | Kasai |
| 2013/0113010 A1 | 5/2013 | Brunner et al. |
| 2013/0181247 A1 | 7/2013 | Jerebic et al. |
| 2014/0022623 A1 | 1/2014 | Yen |
| 2015/0023016 A1 | 1/2015 | Ishihara et al. |
| 2016/0066461 A1 | 3/2016 | Park et al. |
| 2016/0247983 A1 | 8/2016 | Mutschelknaus |

FOREIGN PATENT DOCUMENTS

| | | |
|---|---|---|
| JP | 06-258631 | 9/1994 |
| JP | 2003-337556 | 11/2003 |
| JP | 3622404 | 2/2005 |
| JP | 3875768 | 1/2007 |
| JP | 2010-002516 | 1/2010 |
| JP | 3176533 | 6/2012 |
| JP | 5279616 | 9/2013 |
| KR | 10-1184476 | 9/2012 |
| KR | 10-2016-0028581 | 3/2016 |

OTHER PUBLICATIONS

Extended European Search Report for EP Application No. 17810491.5 dated Nov. 7, 2018.

Search Report and Written Opinion dated Sep. 13, 2017 in counterpart International Patent Application No. PCT/KR2017/005507.

"LED Signage (for indoor use) 1.5mm", Mar. 10, 2016, 7 pages, http://www.samsung.com/sec/business/business-products/smart-led-signage/indoor/LH015ILENAS.

Chinese Office Action dated Dec. 4, 2019 for CN Application No. 201780033053.5.

* cited by examiner

DISPLAY MODULE AND METHOD FOR COATING THE SAME

CROSS-REFERENCE TO RELATED APPLICATIONS

This application is a Divisional of U.S. application Ser. No. 15/477,389, filed Apr. 3, 2017, which claims priority to KR 10-2016-0072740, filed Jun. 10, 2016, the disclosures of which are incorporated herein by reference.

BACKGROUND

Field

The present disclosure relates generally to a display module and a method for coating the same using a coating jig device, and for example, to a display module having a coating layer formed thereon to block sidelight of a plurality of luminous elements that are arranged on a printed circuit board, and a method for coating the display module using a coating jig device that guides edges of the printed circuit board the coating layer to surround side portions of the respective luminous elements.

Description of Related Art

In general, an LED display includes a plurality of LED elements mounted thereon at predetermined intervals. Such an LED display is the next generation display system that substitutes for a typical liquid crystal type display, and has the advantages of high color representation and high luminance picture quality. An LED display having specific resolution is composed of unit modules (hereinafter referred to as "display modules"), and several display modules are connectedly attached in the form of a matrix to form a single display.

However, due to a machining error of the sizes of printed circuit boards of respective display modules and a difference in the degree of close contact between the respective display modules that occurs when the respective display modules are installed on a frame in the form of a series array, a mechanical gap may occur between the display modules to cause a black seam to be visually recognized. Accordingly, in the case of connecting the display modules in the related art in the form of a matrix, it is required to put a great deal of effort in order to prevent the machining error from occurring, and it costs a lot in managing the machining error of the printed circuit board.

In addition, a plurality of LED elements mounted on a display module are disposed with the same intervals. When making a multi-vision by connecting the plurality of display modules, there may be a problem of white seam that luminance between display modules is brighter than luminance between LED elements mounted on a single display module. The reason why white seam occurs is as shown below. When making a printed circuit board of a display module, if a margin (a distance from the outermost LED element to an edge of the printed circuit board) of the printed circuit board is formed to be shorter than a predetermined distance, when a printed circuit board having a short margin (hereinafter 'a first substrate') is connected to a printed circuit board of another display module (hereinafter 'a second substrate'), intervals between the LED element arranged at the outermost of the first substrate and the LED element arranged at the outermost of the second substrate are narrower than the intervals among a plurality of LED elements mounted on a single display module. Due to the above, total light quantity between the LED element arranged at the outermost of the first substrate and the LED element arranged at the outermost of the second substrate is larger than total luminance between two columns of a plurality of LED elements mounted on the single display module and accordingly, a phenomenon that a portion between the first substrate and the second substrate that are arranged adjacent to each other looks brighter, i.e., white seam, occurs.

Further, the display module in the related art is provided with an anode electrode and a cathode electrode that are exposed to an outside. These electrodes may cause the LED elements to be burnt when an electrostatic discharge is projected onto the display module. Due to this, there is a high possibility that a control circuit that is electrically connected to the respective electrodes is damaged. In this case, the electrostatic immunity of the LED element becomes 0 to 2 KV and the electrostatic immunity of the control circuit element connected to the LED element becomes about 1 to 4 KV, which do not satisfy the international standard that corresponds to the electrostatic immunity of 8 KV. Accordingly, it is general to cope with overvoltage by designing a TVS (Transient Voltage Suppressor) diode between the cathode electrode and ground. However, in this case, the manufacturing cost of the display module is increased, and the complexity of the circuit design is increased.

As another means for solving the above-described problem, a transparent coating solvent is spread on one surface of the display module, and such a coating process is mainly performed through spraying, potting, and parylene deposition.

However, according to the coating technology in the related art, a transparent coating solvent is attached to an upper surface of the LED element. In the case where the transparent coating layer is formed on the upper surface of the LED element, picture quality may deteriorate and luminous color may be shifted. Accordingly, the transparent coating layer that is formed on the upper surface of the LED element has light refractive index and permeability that are different from those of an LED molding surface, and thus unintended picture quality deterioration and color change may occur. In order to solve this problem, in order to block unintended light that is emitted from four side surfaces of the LED element, a technology to mount and mold the LED element in an opaque package has been proposed. However, such a technology in the related art has the problem that it is very difficult to implement the technology in a display module that uses micro LED elements that are equal to or smaller than 1 mm×1 mm.

Further, Japanese Registered Patent No. 3875768 (published on Feb. 26, 1999) discloses a configuration in which a filler is coated on a display module having a plurality of LED elements. In this case, the display module is provided with a rear cover that simultaneously surrounds the rear surface and the side surface of a printed circuit board so as to prevent the filler that is coated on one surface of the printed circuit board from being spilled. Such display modules are connected to one another in the form of a matrix to be used in a large-sized electronic signboard that is mainly installed outdoors.

Accordingly, such a display module uses LED elements having relatively large size and also has a large pitch between LEDs, and thus there is no difficulty in coating the filler between the respective LEDs.

However, as described above, such a coating technology has the problem that it is unable to be adopted in coating the coating solvent between the micro LED elements having the size of 1 mm×1 mm. Further, since the display module should always be provided with a rear cover, the side surfaces of the respective rear covers of adjacent modules come in contact with each other, and in this case, the black seam may be seen.

SUMMARY

Example embodiments of the present disclosure are provided to address the above disadvantages and other disadvantages not described above, and provide a display module and a method for coating the same, which can prevent and/or reduce the occurrence of white seam that is caused by luminous elements arranged at the outermost portions of display modules that are arranged adjacent to each other.

Example embodiments of the present disclosure provide a display module and a method for coating the same, which can prevent and/or reduce the occurrence of black seam between display modules that are arranged adjacent to each other.

According to an example aspect of the present disclosure, a display module includes a printed circuit board; a plurality of luminous elements arranged at predetermined intervals on the printed circuit board; and a coating layer disposed between the respective luminous elements and between the luminous elements positioned at an outermost portion of the display module and the edge of the printed circuit board, the coating layer being configured to block side light of the respective luminous elements.

The coating layer may be formed with a height that is substantially equal to a height of the side surface of the luminous element to block light that is emitted to the side surface of the luminous element.

A pitch between the respective luminous elements may be set to a range of 0.3 to 2 mm. The size (width×length×height) of the luminous element may be defined that a range of the width×length is 0.5 mm×0.5 mm to 3 mm×3 mm, and a range of the height is 0.5 mm to 1.2 mm.

The coating layer may cover electrodes of the respective luminous elements. The coating layer may comprise an opaque non-conductive material. For example, the coating layer may comprise silicon, acrylic resin, or epoxy resin. Viscosity of a coating solvent that forms the coating layer may be in a range of 1000 to 10000 p(poise), and more preferably 2000 to 9000 p(poise).

According to another example aspect of the present disclosure, a display module includes a printed circuit board; a plurality of luminous elements mounted at intervals on the printed circuit board; and opaque coating layer formed on the printed circuit board to surround side portions of the respective luminous elements, the opaque coating layer having an edge portion that forms an outer portion of the opaque coating layer, and the edge portion having a projection portion that projects further than an edge of the printed circuit board.

The edge portion of the opaque coating layer may come in contact with an edge portion of an opaque coating layer of another display module arranged adjacent to the display module. In this case, the opaque coating layer may have an elastic force wherein the adjacent coating layers come in close contact with each other without forming a space between them.

The edge portion of the opaque coating layer may project gradually slantingly in a direction away from the printed circuit board. The edge portion of the opaque coating layer may be slanting to form an acute angle with a virtual straight line that vertically extends from the edge of the printed circuit board. The edge portion of the opaque coating layer may have a planar or curved side surface.

According to still another example aspect of the present disclosure, a method for coating a display module includes preparing a display module in which a plurality of luminous elements are mounted at intervals on a printed circuit board; arranging a jig along an edge portion of the printed circuit board; forming a coating layer that surrounds side portions of the respective luminous elements by discharging an opaque coating solvent between the respective luminous elements and between the respective luminous elements positioned at an outermost portion of the display module and the edge of the printed circuit board; and separating the jig from the printed circuit board.

The forming the coating layer may discharge the opaque coating solvent at a height so that the opaque coating solvent surrounds a remaining portion excluding upper surfaces of the respective luminous elements.

The forming the coating layer may fill up to a region that projects further than an edge of the printed circuit board with the opaque coating solvent by means of a slanting surface that is slanting toward an outside of the jig in a direction toward an upper side of the jig.

The method may further include grinding an outside of the coating layer that is formed as the opaque coating solvent is cured.

The opaque coating solvent that is discharged through a nozzle at the forming the coating layer may be controlled by a piezo valve or a pneumatic valve.

The forming the coating layer may discharge the opaque coating solvent through the nozzle having a diameter in a range of 50 to 300 μm.

Additional and/or other aspects and advantages of the disclosure will be set forth in part in the description which follows and, in part, will be apparent from the description.

BRIEF DESCRIPTION OF THE DRAWINGS

The above and/or other aspects of the present disclosure will be more apparent from the following detailed description, taken in conjunction with the accompanying drawings, in which like reference numerals refer to like elements, and wherein.

DETAILED DESCRIPTION

Figure 1:
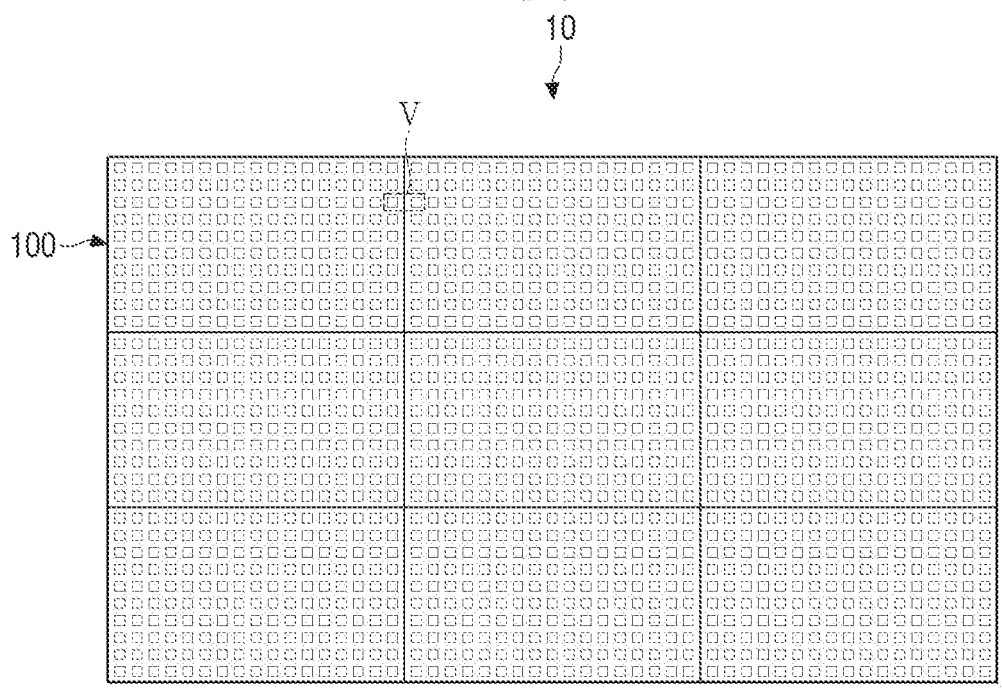
FIG. 1 is a diagram illustrating an example single display device that is formed by arranging display modules in the form of a matrix according to an example embodiment of the present disclosure.

Hereinafter, various example embodiments of the present disclosure will be described with reference to the accompanying drawings. However, it should be understood that the present disclosure is not limited to the various example embodiments described hereinafter, but may include various modifications, equivalents, and/or alternatives of the embodiments of the present disclosure. In relation to explanation of the drawings, similar drawing reference numerals may be used for similar constituent elements.

In the description, the dimensions, which correspond to a size (w1×w2×h1) of a luminous element, a pitch g1 between respective luminous elements, a height h3 of a coating layer, a width w3 of an edge portion of a coating layer, and a width w4 of an edge portion of a printed circuit board, are exemplified to indicate that the size of the luminous elements provided in the display module according to an example embodiment of the present disclosure is small-sized or ultrasmall-sized. In addition, "an edge portion" mentioned in this disclosure is a portion which forms an outer portion of a coating layer and indicates a portion from a side of a luminous element to an edge of a printed circuit board (see 'w4' illustrated in FIG. 3). Further, 'a projection portion' indicates a portion which is extended from the edge portion and further protrudes than an edge of a printed circuit board (see 'w5' illustrated in FIG. 3).

The terms used in the description are used to merely describe an example embodiment, but may not intend to limit the scope of other embodiments. A singular expression may include a plural expression unless specially described. All terms (including technical and scientific terms) used in the description could be used as meanings commonly understood by those ordinary skilled in the art to which the present disclosure belongs. The terms that are used in the present disclosure and are defined in a general dictionary may be used as meanings that are identical or similar to the meanings of the terms from the context of the related art, and they are not interpreted ideally or excessively unless they have been clearly and specially defined. According to circumstances, even the terms that are defined in the present disclosure should not be interpreted to exclude the embodiments of the present disclosure.

Hereinafter, with reference to the accompanying drawings, the configuration of a display module according to an example embodiment of the present disclosure and a method for forming a coating layer on a display module using a jig will be described in greater detail.

FIG. 1 is a diagram illustrating an example single display device that is formed by arranging display modules in the form of a matrix according to an example embodiment of the present disclosure.

Referring to FIG. 1, display modules 100 according to an example embodiment of the present disclosure may be arranged to be mutually connected in the form of a matrix to form a single display device 10. In this example, the single display device 10 may include a driver (not illustrated) for driving the respective display modules 100, a controller (not illustrated) for controlling the driver, a power supply (not illustrated), and a plurality of wirings (not illustrated) for applying various kinds of signals.

Figure 2:
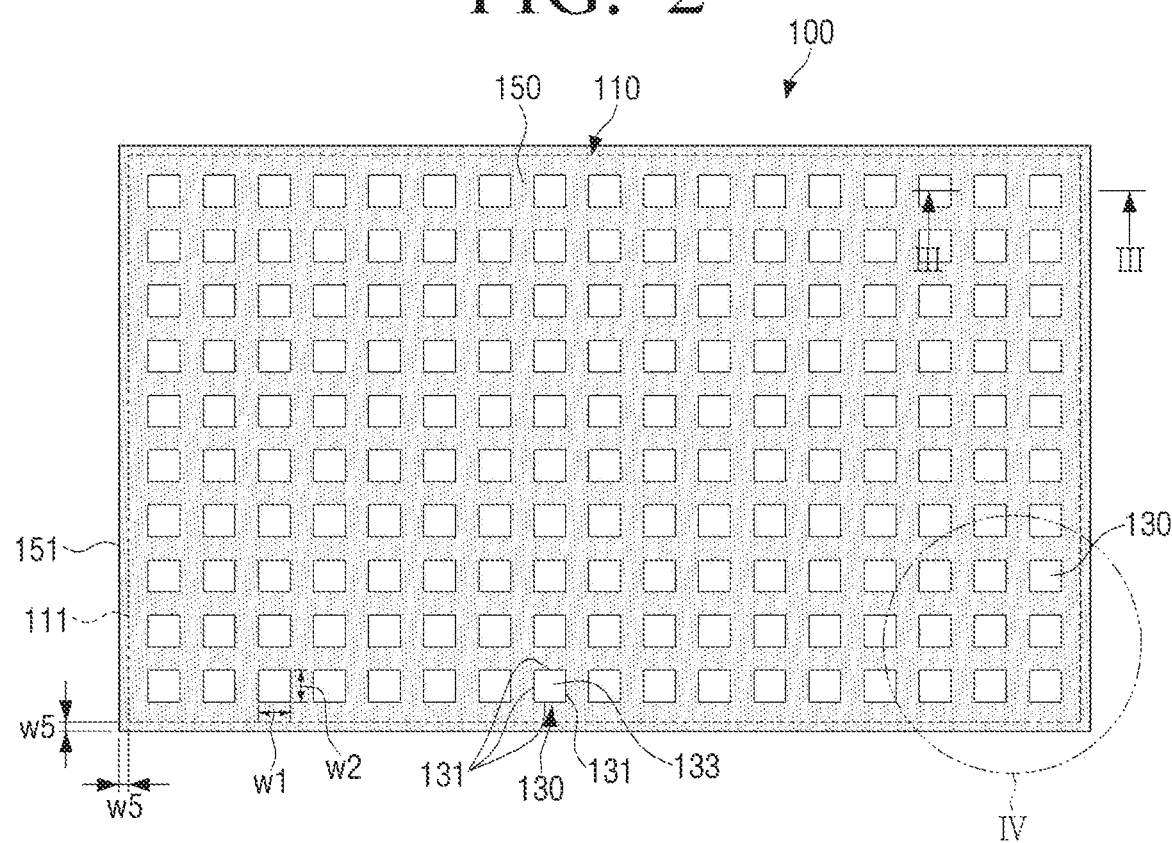
FIG. 2 is a diagram illustrating any one of a plurality of example display modules as illustrated in FIG. 1.
Figure 3:
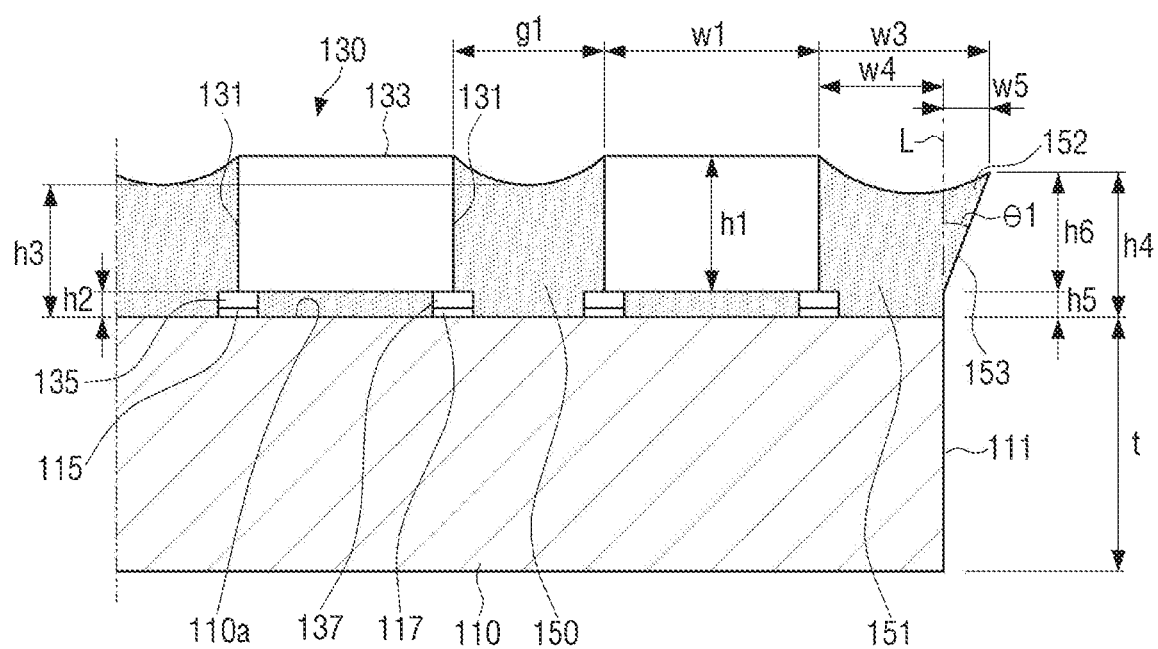
FIG. 3 is a cross-sectional view of an example display module taken along line III-III as indicated in FIG. 2.
Figure 4:
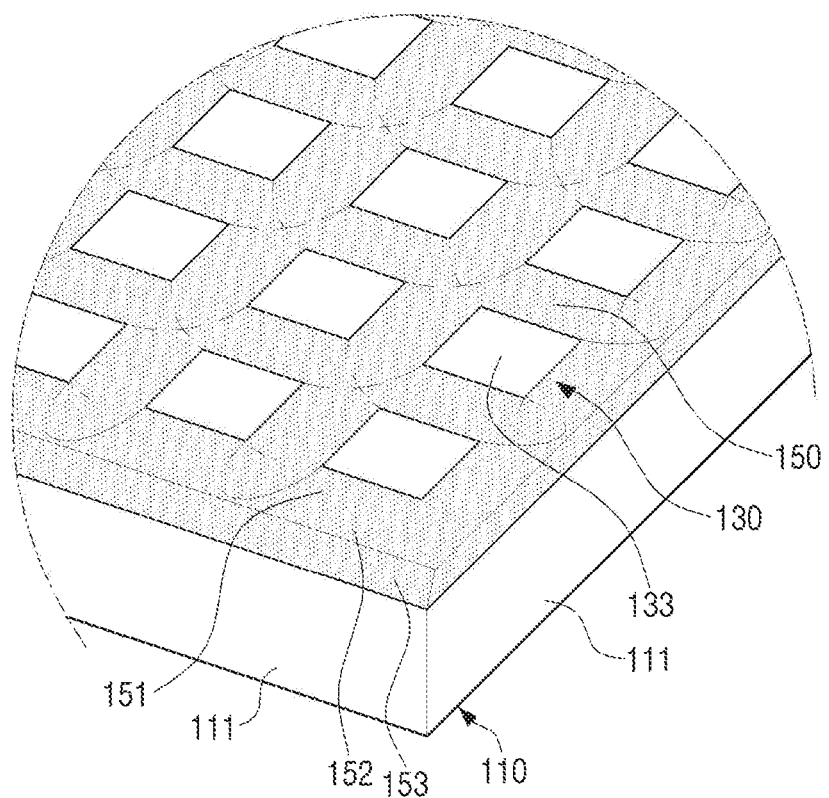
FIG. 4 is a perspective view of an example display module illustrating a part IV as indicated in FIG. 2.

FIG. 2 is a diagram illustrating an example of any one of a plurality of example display modules as illustrated in FIG. 1, and FIG. 3 is a cross-sectional view of an example display module taken along line III-III as indicated in FIG. 2. FIG. 4 is a perspective view of an example display module illustrating a part IV as indicated in FIG. 2.

Referring to FIG. 2, the display module 100 includes a printed circuit board 110, a plurality of luminous elements 130 arranged at predetermined intervals on one surface 110a (see FIG. 3) of the printed circuit board 110, and a coating layer 150 that is coated on the one surface 110a of the printed circuit board 110 on which the plurality of luminous elements 130 are mounted.

The printed circuit board 110 may be in a substantially rectangular shape so that it can be easily arranged in the form of a matrix when the display module 100 is connected to an adjacent display module 100, but is not limited to a rectangular shape.

However, the shape of the printed circuit board 110 is not limited thereto, and the printed circuit board 110 may have any shape so far as it can be easily connected to an adjacent printed circuit board 110. Further, the thickness t (see FIG. 3) of the printed circuit board may be greater than the height h1 of the luminous element 130.

In this example embodiment, the printed circuit board 110 is illustrated as having a planar shape, but is not limited thereto. The printed circuit board 110 may have a curved surface having a predetermined curvature. In this example, a single curved display device may be formed by connecting display modules 100 to one another in the form of a matrix.

Referring to FIGS. 2 and 3, a plurality of luminous elements 130 may be arranged at predetermined intervals on one surface 110a of the printed circuit board 110 in the form of a matrix. Each luminous element 130 may, for example, be substantially in a cuboidal shape, and may be a small-sized or ultrasmall-sized LED having, for example, a size (width (w1)×length (w2)×height (h1)) that is equal to or smaller than 1 mm×1 mm×0.7 mm. In this case, the size of (width×length) may be selected in a range of 0.5 mm×0.5 mm to 3 mm×3 mm, and height may be selected in a range of 0.5 mm to 1.2 mm.

The luminous element 130 may emit light through four side surfaces 131 and an upper surface thereof 133, and an anode electrode 135 and a cathode electrode 137 may be provided on a bottom surface thereof. The anode electrode 135 and the cathode electrode 137 may be soldered onto patterns 115 and 117, respectively, formed on the printed circuit board 110. In this example, the height h2 that is measured from one surface of the printed circuit board 110 to upper ends of the respective electrodes 135 and 137 may be 0.1 mm or about 0.1 mm.

Further, as the size of the luminous element 130 is small or ultrasmall, the pitch g1 of the luminous element 130 may be quite narrow, for example, the pitch may be set to be equal to or smaller than 0.5 mm or about 0.5 mm. Preferably, the pitch g1 of the luminous element 130 may be set within a predetermined range (e.g., 0.3 to 2 mm) in accordance with resolution to be implemented by the single display device 10 (see FIG. 1).

Referring to FIG. 2, the coating layer 150 that is made, for example, of an opaque material is formed to completely surround the four side surfaces 131 and the upper end of the luminous element 130 to block light emission from the four side surfaces 131 of the luminous element 130. In this example, it is preferable that the coating layer 150 is formed with a height to the extent that the coating layer 150 does not cover an upper surface 133 of the luminous element so that light can be emitted only from the upper surface 133 of the luminous element 130 as illustrated in FIG. 4.

The coating layer 150 is coated between the respective luminous elements 130 that are arranged substantially in the form of a matrix, and is coated on an edge 111 of the printed circuit board 110 to surround the respective side surfaces (here, side surfaces indicate those that are directed toward the edge 111 of the printed circuit board 110) of the luminous elements 130 that are arranged at an outermost portion of the display module 100. Accordingly, by blocking light which is emitted from the luminous element 130 arranged at the outermost portion of each of display modules 100 arranged adjacent to each other through the opaque coating layer 150, it is possible to basically prevent occurrence of white seam.

Referring to FIG. 3, the coating layer 150 is filled in not only the four side surfaces 131 of the luminous elements 130 but also in a space formed between the one surface 110a of the printed circuit board 110 and the respective luminous elements 150. In this example, since the anode electrodes 135 and the cathode electrodes 137 of the respective luminous elements 130 are covered by the coating layer 150, they are made waterproof and dustproof, and can be basically prevented from and/or avoid coming in contact with conductive foreign substances. As a result, the luminous elements and electrodes can be safely protected against static electricity.

The coating layer 150 may be opaque and may be made of a non-conductive material. In this example, it is preferable that the coating layer 150 also has elasticity. For example, the coating layer 150 may comprise silicon, acrylic resin, or epoxy resin. In this example, it is preferable that a coating solvent that is provided to form the coating layer 150 has viscosity in a range of about 1000 to 10000 p(poise), and more preferably 2000 to 9000 p(poise) to prevent and/or reduce the possibility of the coating solvent flowing down after being discharged by a nozzle. The coating layer 150 may be dark colored, for example, may be black, in order to effectively block light that is emitted from the side surfaces 131 of the luminous elements 130.

The coating layer 150 may be formed with a height h3 that is lower than the height (h1+h2) of the upper surface of the luminous element 133 so as not to cover the upper surface 133 of the luminous element 130, but is not limited thereto. The coating layer 150 may have any height so far as the side surface of the luminous element 130 can be hidden to the extent that the coating layer 150 can prevent the light emission from the side surfaces of the luminous element 130. For example, if the coating solvent is discharged so that the height h3 of the coating layer 150 becomes about 0.7 mm that is lower than the height (h1+h2) of the upper surface of the luminous element 133, it rises along the side surface 131 of the luminous element 130 to reach a boundary line between the side surface 131 and the upper surface 133 of the luminous element 130 by surface tension until the coating solvent is cured. Accordingly, the upper surface of the coating layer 150 may become a concave surface having a predetermined curvature toward the one surface 110a of the printed circuit board 110. As described above, it is preferable that the height h3 of the coating layer 150 is set to an appropriate height in consideration of the height (h1+h2) of the upper surface of the luminous element 133. In this example, the optimum condition for preventing the white seam is to form the coating layer 150 so that the coating layer 150 completely covers the side surfaces of the luminous elements 130. However, in the actual manufacturing process, the soldering amounts formed between the patterns 115 and 117 of the printed circuit board 110 and the electrodes 135 and 137 of the luminous elements 130 differ from each other, deviation occurs in the mount flatness of the luminous elements, and thus the printed circuit board 110 is minutely flexed in an SMT process that is performed at high temperature. Due to this, the height of the luminous elements 130 that are mounted on the printed circuit board 110, which is measured from the upper surface of the printed circuit board 110 to the upper surfaces of the luminous elements 130 may not be equally maintained, and in this example, the mounting error may be about 1% to 5%. Due to the mounting error, the upper end portions of the side surfaces of the luminous elements 130 may not be minutely covered by the coating layer 150, but this may not cause the white seam.

Figure 5:
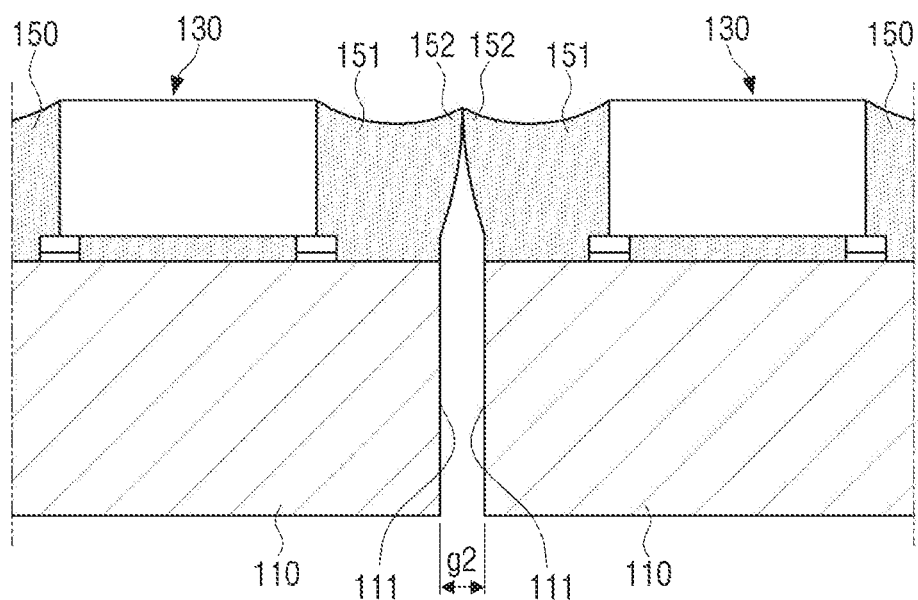
FIG. 5 is a cross-sectional view of a part V as indicated in FIG. 1 illustrating a state where edges of coating layers of adjacent display modules come in contact with each other.

FIG. 5 is a cross-sectional view of a part V as indicated in FIG. 1 illustrating a state where edge portions of coating layers of adjacent display modules come in contact with each other.

Referring to FIG. 5, if a gap g2 is formed between display modules 100 that are adjacently arranged due to a manufacturing tolerance or the like, an edge portion 151 may further include a projection portion 152 and may be formed to project further than an edge 111 of the printed circuit board 110 for a predetermined width w5 (see FIG. 3) so that the gap g2 can be hidden by the coating layer 150 of the display modules 100. Accordingly, as seen from the front of the display module 100 as illustrated in FIG. 2, the outline of the coating layer 150 becomes wider than the outline of the printed circuit board 110, and thus the black seam that may occur in the display device in the related art can be basically blocked.

In this example, the projection portion 152 of the coating layer 150 may be formed to further project only with respect to at least one of edges 111 on four sides of the printed circuit board 110. For example, as illustrated in FIG. 1, when a plurality of display modules 100 are arranged in the form of a matrix, it is enough that the projection portion 152 is formed only on the edge portion 151 of the coating layer 150 that corresponds to sides of the display module, which comes in contact with another display module 100, in accordance with the positions of the display modules 100.

Referring to FIG. 3, the projection portion 152 of the coating layer 150 may be formed up to a predetermined height h4 from the one surface 110a of the printed circuit board 110. In this example, it is preferable that the height of the projection portion 152 is lower than the height (h1+h2) of the upper surface of the luminous element 133.

The width w5 of the projection portion 152 of the coating layer 150 may be smaller than the gap g2 between the printed circuit boards 110 of the adjacent display modules 100, and may be equal to or larger than ½ of the gap g2. The width w5 of the projection portion 152 of the coating layer 150 may be set in consideration of the dimensions that satisfy the condition on which the gap g2 of the printed circuit boards 110 of the adjacent display modules 100 can be hidden by the projection portion 152.

The projection portion 152 of the coating layer 150 may have a slanting surface 153 that is slanting at a predetermined angle θ1 in a lateral direction of the coating layer 150 from the edge portion 151 of the coating layer 150. For example, the angle θ1 of the slanting surface 153 may determine the width w5 of the projection portion 152, and may have various angle values, for example, in a range of about 15° or 30°. The projection portion 152 and the slanting surface 153 may be formed by a jig 200 (see FIGS. 7 and 8) that is arranged along the edges 111 of the printed circuit boards 110 during a coating process. The jig 200 (see FIGS. 7 and 8) may be used in the process of forming the coating layer 150 on one surface 110a of the printed circuit board 110, and the edge portion 151 and the projection portion 152 of the coating layer 150 may be formed by the jig 200.

Hereinafter, referring to FIGS. 6 to 12, an example process of forming a coating layer on a display module according to an example embodiment of the present disclosure will be described in greater detail.

Figure 6:
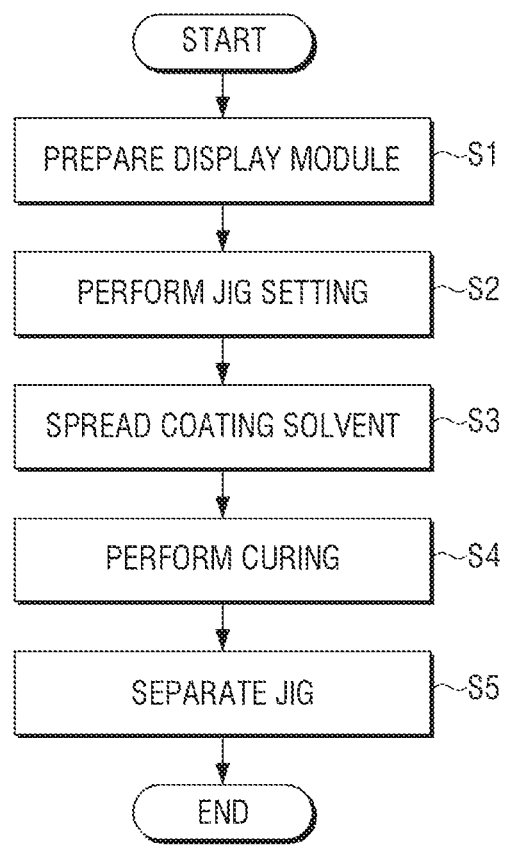
FIG. 6 is a flowchart illustrating an example process of forming a coating layer on a display module according to an example embodiment of the present disclosure.

FIG. 6 is a flowchart illustrating an example process of forming a coating layer on a display module according to an example embodiment of the present disclosure.

First, a display module 100 in which a plurality of luminous elements are arranged at predetermined intervals on one surface 110a of a printed circuit board 110 is prepared (S1). Before forming the coating layer 150, the display module 100 is set on a prescribed die (not illustrated) to perform a coating process.

Figure 7:
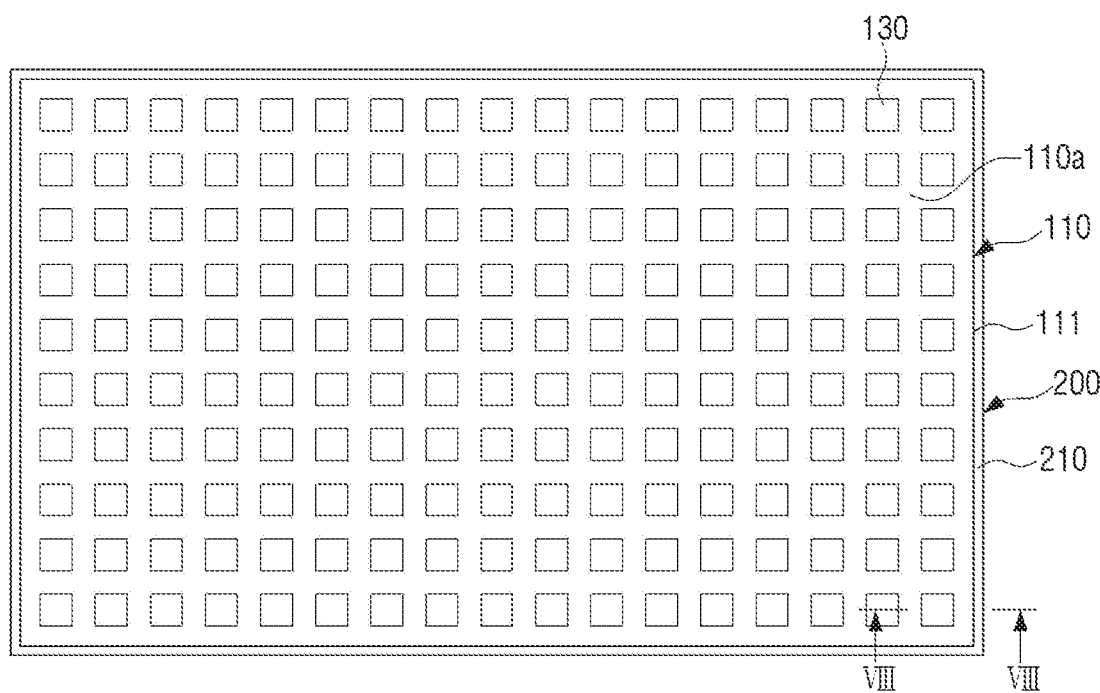
FIG. 7 is a plan view illustrating an example state where a jig is set along edges of four sides of a printed circuit board before a coating layer is formed.
Figure 8:
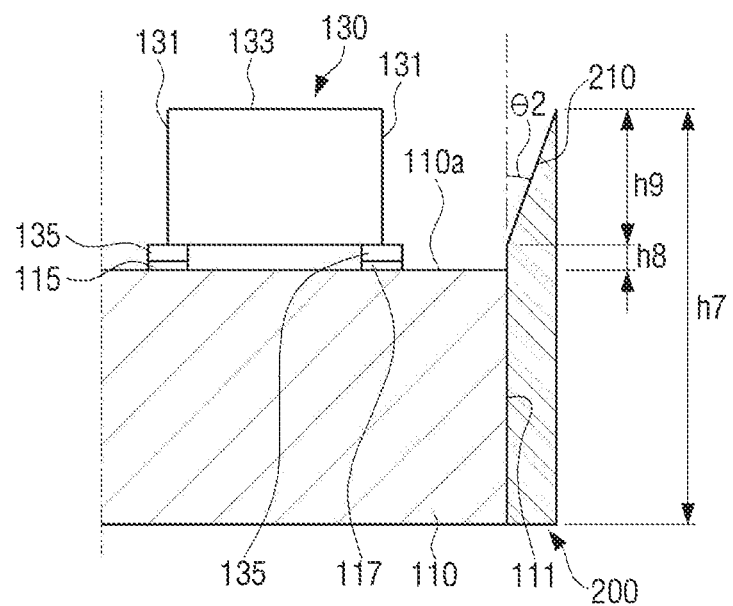
FIG. 8 is a cross-sectional view of an example display module and a jig taken along line VIII-VIII as indicated in FIG. 7.

FIG. 7 is a plan view illustrating an example state where a jig is set along edges of four sides of a printed circuit board before a coating layer is formed, and FIG. 8 is a cross-sectional view of a display module and a jig taken along line VIII-VIII as indicated in FIG. 7.

Referring to FIGS. 7 and 8, a jig 200 is set to come in close contact with edges 111 of four sides of a printed circuit board 110 (S2).

The height h7 of the jig 200 may be set to be equal to or higher than the height of the upper surface 133 of a luminous element 130. This is to prevent and/or avoid a coating solvent L that is discharged between the luminous element 130 and the jig 200 from overflowing to an outside, and in this example, it is preferable to additionally consider the discharge amount of the coating solvent L being discharged.

Further, in order to form a projection portion 152 of a coating layer 150, a support surface 210 may be formed on the inside of the jig 200. The support surface 210 may be formed to be slanting at a predetermined angle θ2 in an outward direction of the jig 200 in a direction from a prescribed position (i.e., height h8 as illustrated in FIG. 8) to an upward direction with respect to an inner surface of the jig 200. In this example, the slanting angle θ2 of the support surface 210 may determine the angle θ1 of the slanting surface 153 of the projection portion 152.

Figure 9:
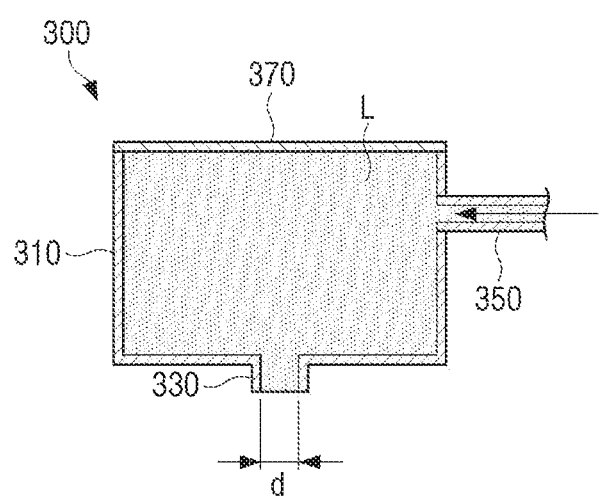
FIG. 9 is a diagram illustrating an example discharge device for discharging a coating solvent that is filled between respective luminous elements of a display module and between the outermost luminous element and a jig.
Figure 10A:
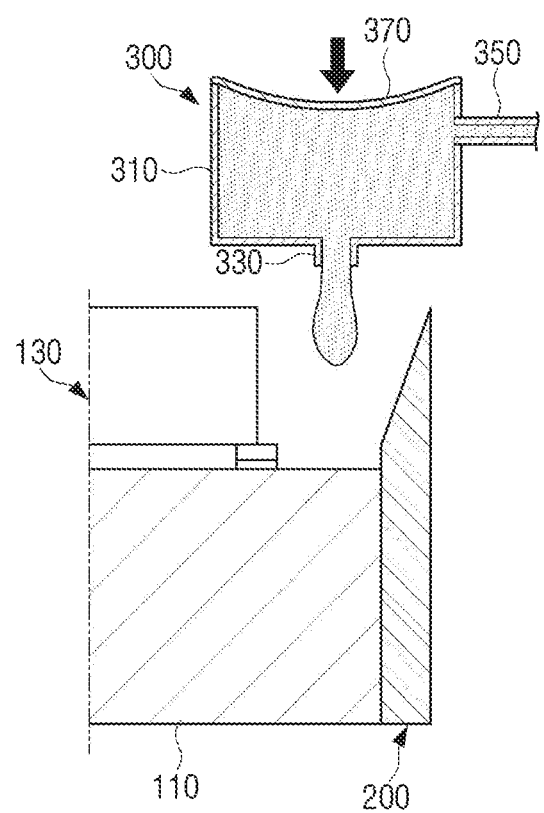
FIGS. 10A and 10B are diagrams illustrating an example process of discharging a coating solvent through an operation of a piezo valve that is provided in an example discharge device.
Figure 10B:
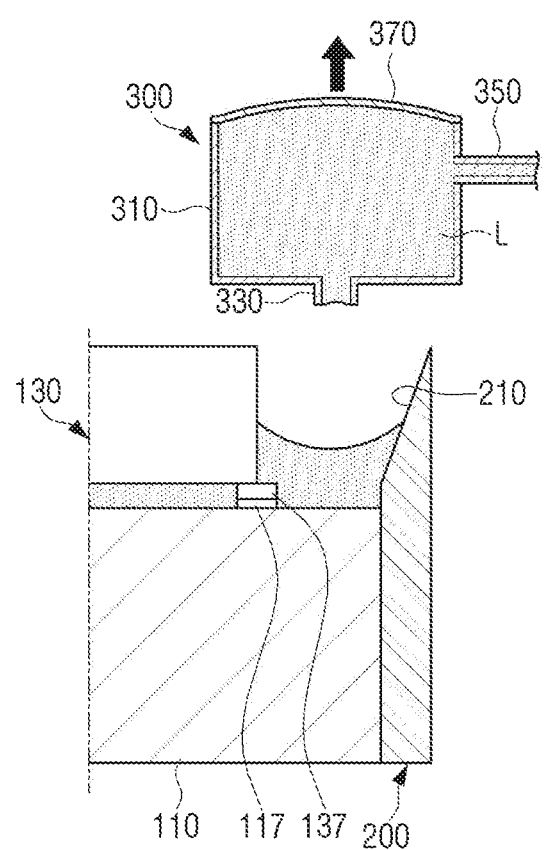

FIG. 9 is a diagram illustrating an example discharge device for discharging a coating solvent that is filled between respective luminous elements of a display module and between the outermost luminous element and a jig, and FIGS. 10A and 10B are diagrams illustrating an example process of discharging a coating solvent through an operation of a piezo valve that is provided in an example discharge device.

As described above, if setting of a jig 200 is completed, a coating solvent L is spread onto one surface 110a of a printed circuit board 110 as a discharge device 300 for discharging the coating solvent L is moved (S3).

If the setting of the jig 200 is completed, the coating solvent L is supplied from a coating solvent supply source (not illustrated) and is temporarily stored in a storage chamber 310 of the discharge device 300. The storage chamber 310 may include a nozzle 330 formed on the lower side of the storage chamber 310 to discharge the coating solvent L, and a supply pipe 350 formed on one side of the storage chamber 310 to supply the coating solvent L. In this example, it is preferable that the nozzle 330 has a diameter d in a range of 50 to 300 μm that is smaller than the gap g1 so that the coating solvent L can be filled in a very narrow gap g1 of 0.3 to 2 mm between the respective luminous elements 130. The diameter d of the nozzle 330 is set in consideration of the condition on which the upper surfaces of the luminous elements 130 are not stained with the coating solvent L when the coating solvent L is discharged. Further, the coating solvent L may have viscosity in a range of about 2000 to 9000 p(poise) to lower and/or control the speed at which the coating solvent L flows down from one surface 110a of the printed circuit board 110 (or to make the coating solvent L maintain its shape to some extent) after being discharged by the nozzle 330.

Further, the discharge device 300 may be provided with a piezo valve (or micro piezo valve) 370 provided on an upper side of the storage chamber 310 to discharge a minute amount of the coating solvent L. If a power is applied, the shape of the piezo valve 370 is alternately modified as illustrated in FIGS. 10A and 10B, and the piezo valve 370 discharges a predetermined amount of coating solvent L that is stored in the storage chamber 310 through the nozzle 330. For example, if the piezo valve 370 is drawn to the inside of the storage chamber 310 as illustrated in FIG. 10A, the coating solvent L that is stored in the storage chamber 310 is pressed, and a predetermined amount of the coating solvent L is discharged through the nozzle 330. On the other hand, if the piezo valve 370 projects to an outside of the storage chamber 310 as illustrated in FIG. 10B, the discharge operation of the coating solvent L that is stored in the storage chamber 310 is temporarily stopped.

The discharge device 300 discharges a prescribed amount of the coating solvent L as moving on X-axis and Y-axis between the respective luminous elements at a predetermined speed. In this example, it is preferable that the discharge amount of the coating solvent L is set in consideration of the extent that corresponds to the height h3 (see FIG. 3) of a coating layer 150 to be formed, which can completely surround the side surfaces of the luminous elements 130.

As described above, in the process in which the coating solvent L is filled between the respective luminous elements 130 and between the luminous elements positioned at the outermost portion and the jig 200, the coating solvent L covers between one surface 110a of the printed circuit board 110 and the bottom surfaces of the luminous elements 130, the anode electrodes 135 and the cathode electrodes 137 of the luminous elements 130, and the patterns 115 and 117 of the printed circuit board 110 in all.

Figure 11:
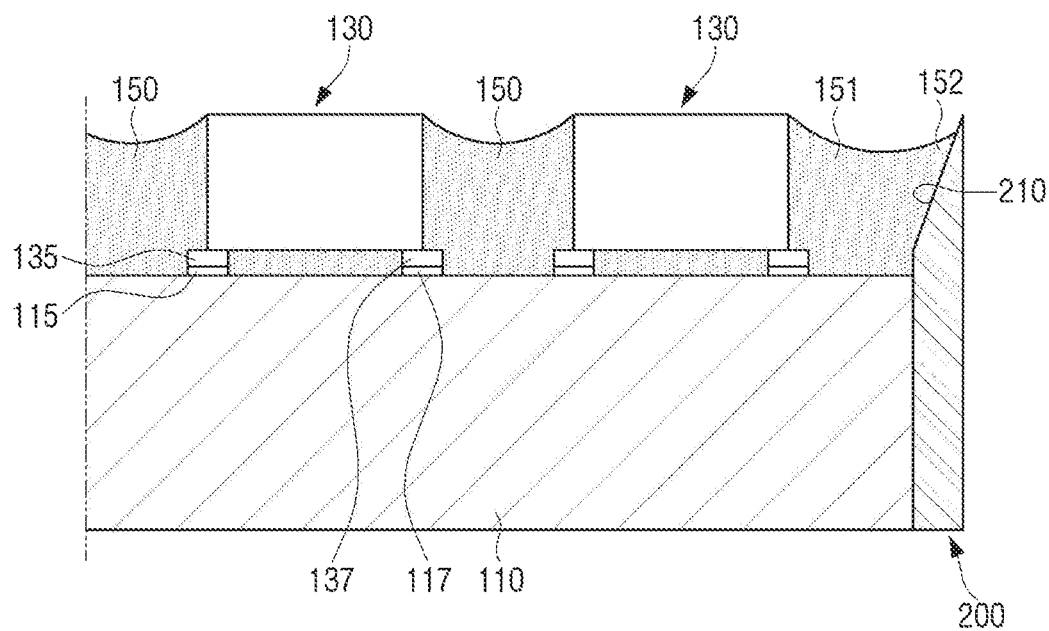
FIG. 11 is a cross-sectional view illustrating a state where filling of a coating solvent between respective luminous elements of a display module and between the outermost luminous element and a jig is completed.

FIG. 11 is a diagram illustrating an example state where filling of a coating solvent between respective luminous elements of a display module and between the outermost luminous element and a jig is completed.

As illustrated in FIG. 11, if the coating solvent L is filled at a predetermined height, the coating solvent L is cured for a predetermined time in a state where the jig 200 maintains its setting state to form the coating layer 150 (S4).

If the coating layer 150 is formed through curing of the coating solvent L, the jig 200 is separated from the edges 111 of the printed circuit boards 110 (S5). A normal coating solvent has viscosity after being cured, and thus it may be difficult to separate the jig 200 from the coating layer 150. In order to address this problem, the surface of the jig 200 may be processed with a special material having a release property, for example, Teflon.

Thereafter, the slanting surface 153 that is provided on the projection portion 152 of the coating layer 150 may be processed using a prescribed tool. For example, a cutting process may be performed to smooth the slanting surface 153 using a grinder (not illustrated). In this example, it is also possible to set the slanting angle of the slanting surface 153 through the cutting process.

Figure 12:
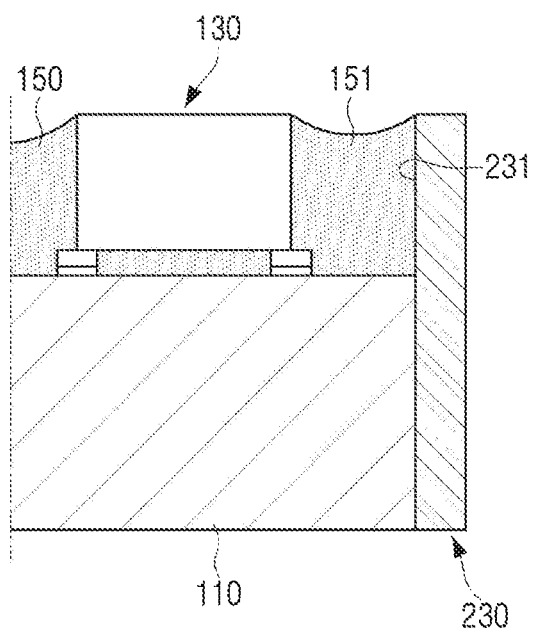
FIG. 12 is a cross-sectional view illustrating another example of a jig that guides filling of a coating solvent.

FIG. 12 is a diagram illustrating another example of a jig that guides filling of a coating solvent.

As described above, when a plurality of display modules 100 are arranged in the form of a matrix, it is not necessary to form the projection portion 152 on the edge portion 151 of the coating layer 150 on the side that does not come in contact with the adjacent display modules in accordance with the positions of the display modules 100. Accordingly, in the case of forming the edge portion 151 having no projection portion 152, another jig 230 of which the support surface 231 is not slantingly formed as illustrated in FIG. 12 may be used. In this example, the support surface 231 of the other jig 230 may be formed to be positioned substantially on the same plane as the edge 111 of the printed circuit board 110.

Accordingly, in this example embodiment, when the coating layer 150 is formed, a jig 200 having a slanting support surface 210 and another jig 230 having a non-slanting support surface 231 may be variously used.

FIGS. 13A, 13B, 13C and 13D are cross-sectional diagrams illustrating various example cross-sectional shapes of an edge portion of a coating layer.

The coating layer 150 provided on the display module 100 may have diverse shapes in accordance with the shape (plane, curved surface, or multi-stage bending surface) of the support surface 210 of the jig 200.

Figure 13A:
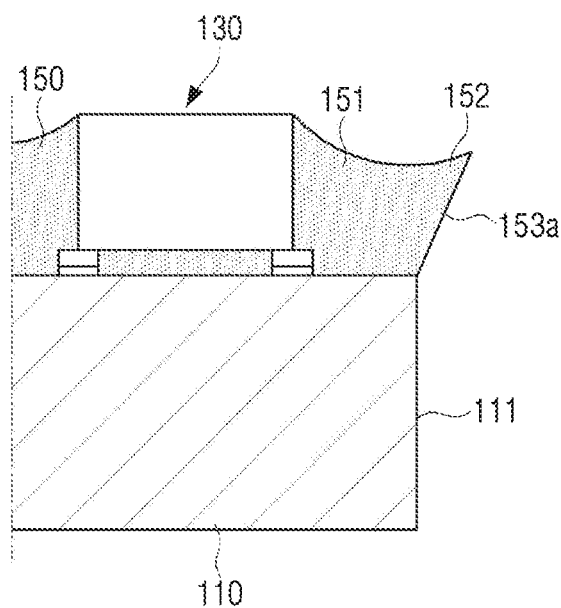
FIGS. 13A, 13B, 13C and 13D are cross-sectional views illustrating various example cross-sectional shapes of an edge portion of a coating layer.

For example, referring to FIG. 13A, one side surface 153a of the projection portion 152 may be slantingly formed at a prescribed height, starting from the edge 111 of the printed circuit board 110.

Figure 13B:
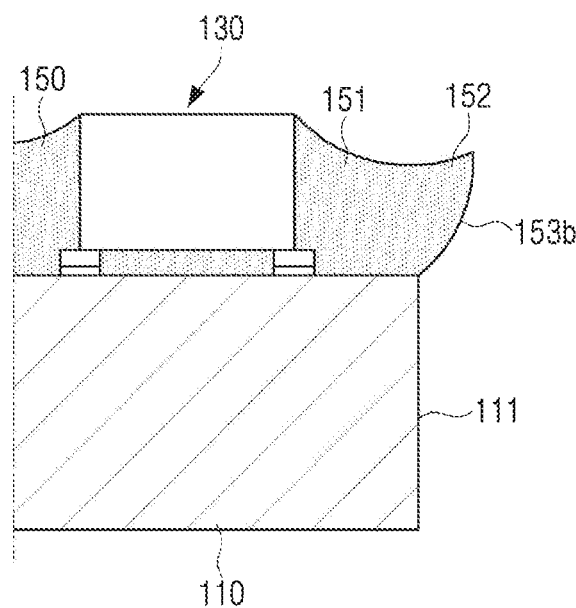
Figure 13C:
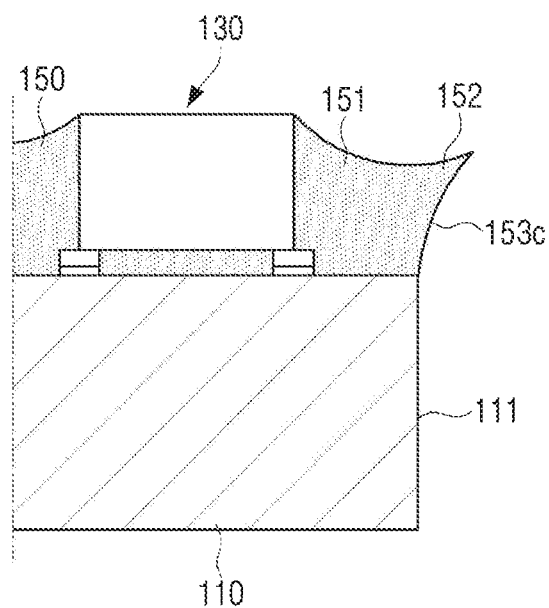
Figure 13D:
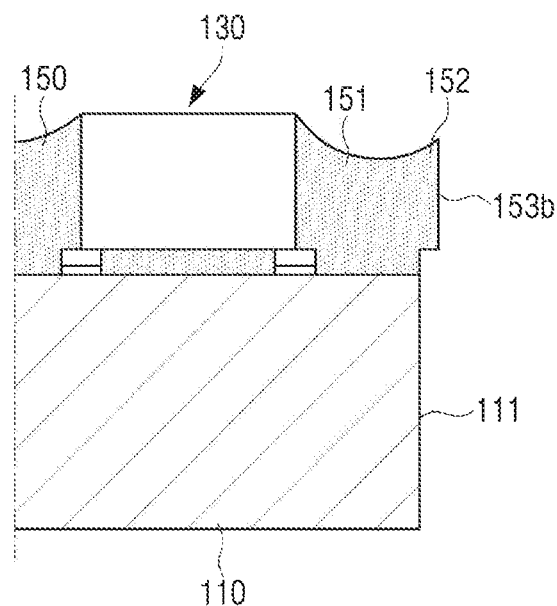

Further, as illustrated in FIG. 13B, one side surface 153b of the projection portion 152 may be formed as a curved surface that is convex to an outside of the edge portion 151, or as illustrated in FIG. 13C, one side surface 153c of the projection portion 152 may be formed to be concave to the inside of the edge portion 151. Further, as illustrated in FIG. 13D, one side surface 153d of the projection portion 152 may have a multi-stage bent surface.

On the other hand, the discharge device 300 used in this example embodiment is provided with the piezo valve (or micro piezo valve) 370 for micro discharge control of the coating solvent L, but is not limited thereto. It is also possible to use a pneumatic valve (not illustrated), or the like.

The foregoing example embodiments and advantages are merely examples and are not to be construed as limiting the present disclosure. The present teaching can be readily applied to other types of apparatuses. Also, the description of the example embodiments of the present disclosure is intended to be illustrative, and not to limit the scope of the claims, and many alternatives, modifications, and variations will be apparent to those skilled in the art.

What is claimed is:

1. A method for coating a display module comprising:
preparing a display module comprising a plurality of luminous elements mounted on a printed circuit board;
arranging a jig along an edge of the printed circuit board, the edge of the printed circuit board provided at an edge of the display module containing the printed circuit board;
forming a coating layer that surrounds side portions of the each of the luminous elements by discharging an opaque coating solvent between each of the luminous elements and the coating also positioned at the edge of the printed circuit board provided at the edge of the display module; and
separating the jig from the printed circuit board,
wherein the forming the coating layer comprises filling up to a region that projects further than the edge of the printed circuit board with the opaque coating solvent using a slanting surface of the jig that is slanting toward an outside of the jig in a direction toward an upper side of the jig.

2. The method as claimed in claim 1, wherein the forming the coating layer comprises discharging the coating solvent at a height wherein the coating solvent surrounds a remaining portion excluding upper surfaces of the each of luminous elements.

3. The method as claimed in claim 1, wherein the edge portion of the coating layer has a planar or curved side surface.

4. The method as claimed in claim 1, further comprising grinding an outside of the coating layer.

5. The method as claimed in claim 1, wherein discharging the opaque coating solvent is controlled by a piezo valve or a pneumatic valve.

6. The method as claimed in claim 5, wherein the discharging the opaque coating solvent comprises discharging the opaque coating solvent through a nozzle having a diameter in a range of 50 to 300 μm.

* * * * *